United States Patent

Takeda

Patent Number: 5,262,681
Date of Patent: Nov. 16, 1993

[54] TRIGGER SOURCE SWITCHING CIRCUIT

[75] Inventor: Takuya Takeda, Kawasaki, Japan

[73] Assignee: Kikusui Electronics Corporation, Kanagawa, Japan

[21] Appl. No.: 26,640

[22] Filed: Mar. 5, 1993

Related U.S. Application Data

[63] Continuation of Ser. No. 944,717, Sep. 14, 1992, abandoned, which is a continuation of Ser. No. 755,133, Sep. 5, 1991, abandoned.

[30] Foreign Application Priority Data

Oct. 31, 1990 [JP] Japan .................. 2-291716

[51] Int. Cl.$^5$ .................. H03K 17/76
[52] U.S. Cl. .................. 307/243; 307/242; 307/364; 307/520; 307/529; 328/104; 328/154; 328/157
[58] Field of Search ......... 307/231, 241, 243, 521, 307/522, 524, 242, 529, 520, 364; 328/104, 137, 154, 167

[56] References Cited

U.S. PATENT DOCUMENTS

| | | | |
|---|---|---|---|
| 3,548,322 | 12/1970 | James | 307/524 |
| 4,031,506 | 6/1977 | Siems | 328/137 |
| 4,066,919 | 1/1978 | Huntington | 307/242 |
| 4,370,632 | 1/1983 | Allgood et al. | 307/241 |
| 4,446,390 | 5/1984 | Alaspa | 307/243 |
| 4,494,073 | 1/1985 | Sorgi | 307/529 |
| 4,525,675 | 6/1985 | Richmond et al. | 307/522 |
| 4,536,666 | 8/1985 | Metz et al. | 307/510 |
| 4,578,594 | 3/1986 | Santos | 307/241 |
| 4,847,523 | 7/1989 | Schneider | 307/490 |
| 4,857,778 | 8/1989 | Hague | 307/521 |
| 4,894,566 | 1/1990 | Rush | 307/540 |
| 4,972,157 | 11/1990 | Moyal | 328/154 |
| 5,043,609 | 8/1991 | Uno et al. | 307/529 |
| 5,061,861 | 10/1991 | Sameshima et al. | 307/241 |

Primary Examiner—William L. Sikes
Assistant Examiner—Terry D. Cunningham
Attorney, Agent, or Firm—Finnegan, Henderson, Farabow, Garrett & Dunner

[57] ABSTRACT

A trigger source switching circuit including a first switch system for a high frequency region, and a second switch system for a low frequency region. The first switch system is composed of a plurality of semiconductor switches having good frequency and isolation characteristics, and the adverse effect of the DC shift is eliminated by using a capacitor connected between the outputs of the semiconductor switches and the output terminal of the trigger source switching circuit. The second switch system for the low frequency region is composed of analog switches, and the output terminal of each analog switch is connected to an input terminal of an operational amplifier of a small output offset, thereby reducing the effect of the on-resistance of the analog switches and the adverse effect of the DC shift. The analog switches can be used because the frequency and isolation characteristics required in the high frequency region are unnecessary in the low frequency region.

17 Claims, 2 Drawing Sheets

TRIGGER SOURCE SWITCHING CIRCUIT

This application is a continuation of application Ser. No. 07/944,717 filed Sep. 14, 1992, now abandoned, which is a continuation of application Ser. No. 07/755,133, filed Sep. 5, 1991, now abandoned.

BACKGROUND OF THE INVENTION

1. Field of the Invention

The present invention relates to a trigger source switching circuit for selecting a trigger source signal, which is applied to an oscilloscope or the like.

2. Description of the Prior Art

FIG. 1 is a circuit diagram showing a trigger source switching circuit used in a conventional oscilloscope. In FIG. 1, a switching circuit 21 for selecting one of four trigger signals S1-S4 is connected in cascade with a coupling circuit 22. The coupling circuit 22 comprises a capacitor C3, a switch SW8 connected in parallel with the capacitor C3, a resistor R11, and a switch SW9 connected in series with the capacitor C3. The capacitor C3 is for passing an alternating current signal, and the switch SW8 is for passing a direct current signal. The switch SW9 is for selecting one of the following three modes: a through mode; a high rejection mode by using a low-pass filter composed of a resistor 12 and a capacitor C4, and a low rejection mode by using a high pass filter composed of a capacitor C5 and a resistor R13.

As a switching circuit 21, four semiconductor switches, each of which has an arrangement as shown in FIG. 2, are used to be controlled by a CPU or the like. Each semiconductor switch comprises two stage emitter followers which are composed of a transistor Q7 and a resistor R14 and a transistor Q8 and a resistor R15, respectively, and a switch SW10 for supplying a voltage Vcc to the base of the transistor Q8.

The circuit of FIG. 1, however, includes at least two switches in the passage of the trigger signal, and hence, deteriorates the high frequency characteristic.

Furthermore, although the semiconductor switch shown in FIG. 2 has good frequency and isolation characteristics, it has variations and temperature drift in the DC component of the output due to variations and temperature drift in the base-to-emitter voltage $V_{BE}$ of the transistors Q7 and Q8.

SUMMARY OF THE INVENTION

Accordingly, it is an object of the present invention to provide a trigger source switching circuit, which eliminates the above-described disadvantages associated with the conventional trigger source switching circuit.

In the aspect of the present invention, a trigger source switching circuit comprises:

a plurality of input terminals each of which receives one of a plurality of input signals;

an output terminal;

a plurality of semiconductor switches each of which is connected to one of the plurality of input terminals for passing or blocking the input signal applied to the input terminal, and functions as a buffer amplifier of a high frequency component of the input signal;

a plurality of low frequency switches each of which is connected to one of the plurality of input terminals for passing or blocking a low frequency component of the input signal applied to the input terminal;

a buffer amplifier for receiving an output signal of one of the plurality of low frequency switches;

a capacitor for supplying the output terminal with an output signal of one of the plurality of semiconductor switches; and a resistor for supplying the output terminal with an output signal of the buffer amplifier.

Here, each of the plurality of semiconductor switches may block the input signal, and at least one of the plurality of semiconductor switches may AC ground the capacitor at an output side of the one of the plurality of semiconductor switches.

The trigger source switching circuit may further comprise grounding means for grounding the resistor at an output side of the buffer amplifier.

Each of the plurality of semiconductor switches may be opened or closed by means of analog switches, and each of the plurality of low frequency switches may be an analog switch.

The trigger source switching circuit may further comprise a control circuit for controlling the analog switches of the plurality of semiconductor switches and of the plurality of low frequency switches.

The control circuit may be connected to a remote-control device.

Each of the plurality of semiconductor switches may comprise:

a first emitter follower whose base is connected to one of the plurality of input terminals, and which functions as an input stage;

a second emitter follower whose base is connected to an output of the first emitter follower, and which functions as an output stage; and a transistor for turning on the first and second emitter followers when the input signal applied to the first emitter is to be passed, and for turning off at least the first emitter follower when the input signal applied to the first emitter is to be blocked.

The transistor may lock an output of the second emitter follower at a fixed voltage in such a way that the resistor is AC grounded through the capacitor and the second emitter follower.

The present invention uses two switch systems: the semiconductor switches for the high frequency region; and the low frequency switches for the low frequency region. The semiconductor switches have good frequency and isolation characteristics, and in addition, the adverse effect of the DC shift is eliminated by using the capacitor connected between the outputs of the semiconductor switches and the output terminal of the trigger source switching circuit. On the other hand, each low frequency switch is the analog switch, and the output terminal of each analog switch is connected to an input terminal of the operational amplifier of a small output offset, thereby reducing the effect of the on-resistances of the analog switches and the adverse effect of the DC shift. The analog switches can be used because the frequency and isolation characteristics required in the high frequency region is unnecessary in the low frequency region.

The present invention provides the following effects:

(1) The adverse effect of the DC shift due to the temperature drift and variations in the switch devices can be reduced;
(2) Good frequency characteristics can be achieved;
(3) Good isolation can be obtained;
(4) The coupling circuit can be arranged with a small number of components; and (5) Remote control of the trigger source switching circuit can be carried out.

The above and other objects, effects, features and advantages of the present invention will become more apparent from the following description of the embodiment thereof taken in conjunction with the accompanying drawings.

DETAILED DESCRIPTION OF PREFERRED EMBODIMENTS

The invention will now be described with reference to the accompanying drawings.

EMBODIMENT 1

Figure 1:
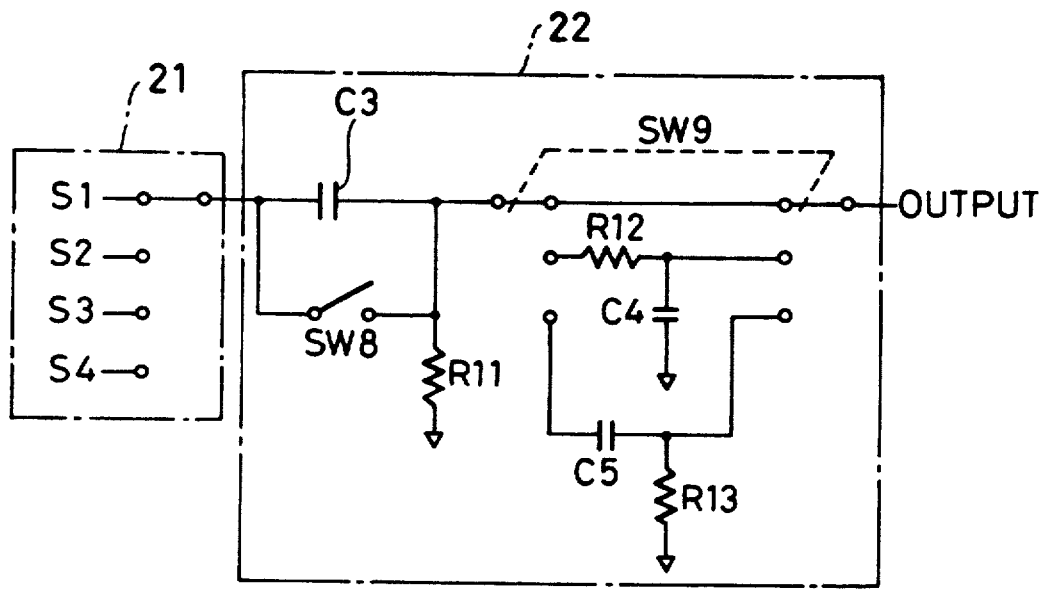
FIG. 1 is a circuit diagram showing an arrangement of a trigger source switching and coupling circuit used in a conventional oscilloscope.
Figure 2:
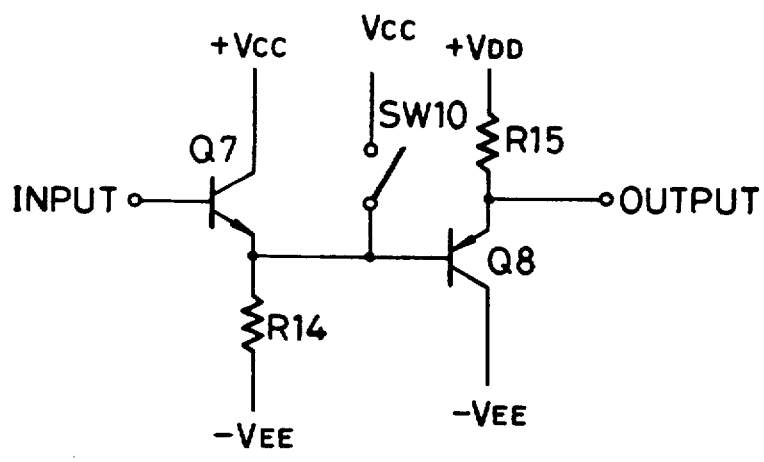
FIG. 2 is a circuit diagram showing an arrangement of a T-type switch.
Figure 3:
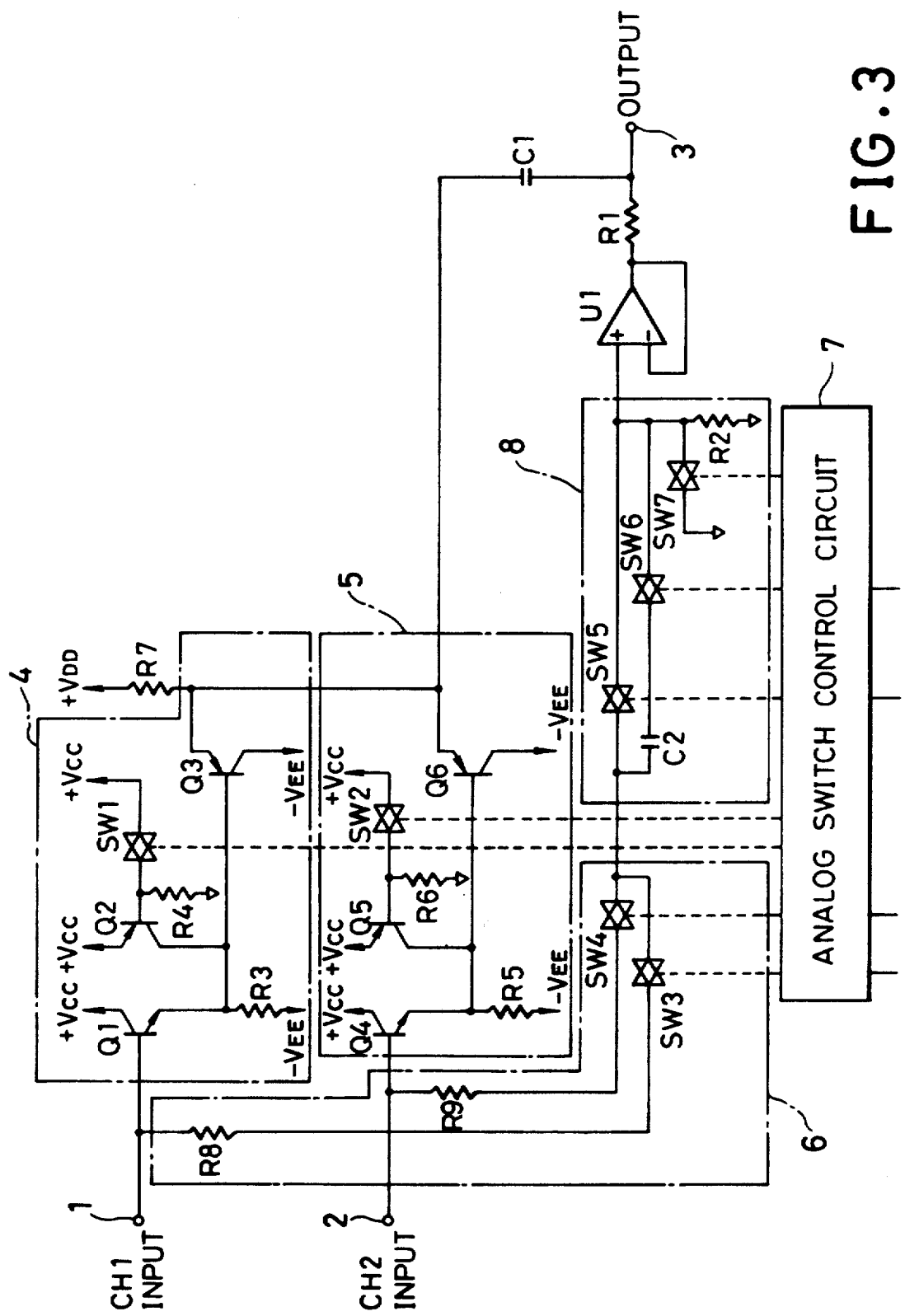
FIG. 3 is a circuit diagram showing an arrangement of a trigger source switching circuit as an embodiment of the present invention.

FIG. 3 is a circuit diagram showing an arrangement of a trigger source switching circuit of an embodiment of the present invention.

In FIG. 3, input terminals 1 and 2 are provided for entering trigger signals of a channel 1 (CH1) and a channel 2 (CH2), respectively. A selected trigger signal is produced from an output terminal 3.

T-type switches 4 and 5 are connected to the input terminals 1 and 2, respectively, as switching systems for a high frequency region. The inputs of the switches 4 and 5 are connected to the input terminals 1 and 2, respectively, and the outputs of the switches 4 and 5 are connected in common to a first terminal of a capacitor C1 whose second terminal is connected to an output terminal 3.

The T-type switch 4 comprises three transistors Q1, Q2 and Q3, resistors R3 and R4, and a switch SW1 for switching a voltage +Vcc applied to the base of the transistor Q2. Likewise, the T-type switch 5 comprises three transistors Q4, Q5 and Q6, resistors R5 and R6, and a switch SW2 for switching the voltage +Vcc applied to the base of the transistor Q5. A voltage $+V_{DD}$ (> +Vcc) is applied to the emitters of the transistors Q3 and Q6 through a resistor R7. Analog switches are used as the switches SW1 and SW2.

When the switch SW1 is closed, the transistor Q2 is cutoff, which turns on the transistors Q1 and Q3, thereby closing the switch 4. In contrast, when the switch SW1 is open, the transistor Q2 is turned on, which cuts off the transistors Q1 and locks the output of the transistor Q3 at approximately +Vcc, thereby opening the switch 4. The switch 5 operates in a similar manner.

Although the T-type switches 4 and 5 have good frequency and isolation characteristics, they have a problem of DC shift, i.e., of variations and temperature drift in the base-to-emitter voltage $V_{BE}$ of the transistors Q1 and Q3, and Q4 and Q6. These problems can be eliminated by supplying the output signals of the T-type switches 4 and 5 to the output terminal 3 through the capacitor C1 so as to form an alternating-current coupling between them. Incidentally, the switches SW1 and SW2 may be replaced with logic signals to turn on and off the transistors Q2 and Q5.

A switching circuit 6, which functions as the switching system for the low frequency region, comprises switches SW3 and SW4, and resistors R8 and R9.

First ends of the switches SW3 and SW4 are connected to the input terminals 1 and 2 through the resistors R8 and R9, respectively, and second ends of the switches SW3 and SW4 are connected in common to a first terminal of a switch SW5. Here, the switch SW5 together with switches SW6 and SW7, a resistor R2 and a capacitor C2 constitutes a mode switching circuit 8. More specifically, the second terminal of the switch SW5 is connected to the noninverting input terminal of an operational amplifier U1 functioning as a buffer amplifier. A serial circuit of the capacitor C2 and the switch SW6 is connected in parallel with the switch SW5, and the noninverting input terminal of the operational amplifier U1 is grounded via the switch SW7 or the resistor R2. The inverting input terminal of the operational amplifier U1 is connected to the output terminal thereof which in turn is connected to the output terminal 3 of the trigger source switching circuit via a resistor R1. The on/off control of these switches SW1-SW7 is carried out by an analog switch control circui 7. The control circuit 7 may be connected to a remote-control device so as to be controlled by the remote-control device.

The switches SW5, SW6 and SW7 of the mode switching circuit 8 function exclusively, that is, only one switch out of the three switches SW5, SW6 and SW7 is closed at a time so that one of the DC coupling mode (when the switch SW5 is closed), AC coupling mode (when the SW6 is closed), high frequency rejection mode (when the switch SW5 is closed and the switches SW1 and SW2 are open) and low frequency rejection mode (when the switch SW7 is closed). The switches SW3-SW7 are not required to satisfy the high frequency characteristic, and hence, analog switches can be employed. The operational amplifier U1 includes an FET input circuit so as to achieve a high input impedance. Consequently, the adverse effects of the DC shift, namely, the temperature drift and variations in the DC voltage due to the on-resistance of the analog switches can be restricted by the buffering of the operational amplifier U1.

The high frequency component of the input signal passing the T-type switch 4 or 5 and the capacitor C1 is mixed with the low frequency component of the input signal passing the operational amplifier U1 and the resistor R1, and is fed to the output terminal 3.

Next, the operation of this embodiment when the channel 1 is selected will be described.

To select the channel 1, the switches SW1 and SW3 are closed, whereas the switches SW2 and SW4 are opened. Therefore, transistors Q2 is turned off so that the transistors Q1 and Q3 are conductive, whereas the transistor Q5 is turned on so that the transistor Q4 is cutoff and the output of the transistor Q6 is locked at approximately +Vcc. The input signal applied to the input terminal 1 is divided into two components each of which is supplied to the output terminal 3 through a different path: the low frequency component of the input signal passes through the switch SW3 and switch SW5, or the switch SW3 and the capacitor C2 and the switch SW6, and is buffered by the operational amplifier U1 to be fed to the output terminal 3 through the resistor R1; whereas the high frequency component of the input signal passes the conductive transistors Q1 and Q3 and the capacitor C1 to be supplied to the output terminal 3. Thus, the channel 1 is selected.

In this case, since the switch SW4 is open, and the transistor Q4 is cutoff and the output of the transistor Q5 is locked at approximately +Vcc, the input signal to the input terminal 2 of the channel 2 is not transmitted to the output terminal 3. Thus, the channel 2 is in the off-state. Here, in the T-type switch 5, since the transistor Q5 is in the saturation state, the storage capacitance of the transistor Q5 reduces the crosstalk due to the base-to-collector capacitance $C_{BE}$ and other stray capacitances. In addition, since the transistor Q4 is cutoff and the output of the transistor Q6 is locked at approximately +Vcc, good isolation can be achieved.

The channel 2 can be selected by opening the switches SW1 and SW3, and by closing the switches SW2 and SW4. The description of the operation will be omitted because it can be easily understood from that of the channel 1.

Next, four modes of coupling operation will be described, supposing that the channel 1 is selected.

(1) DC COUPLING MODE

When the switch SW5 is closed, a direct current coupling is formed from the input terminal 1 to the input of the operational amplifier U1. In this DC coupling mode, in the low frequency range of the switching circuit 6 and the operational amplifier U1, the signal produced from the operational amplifier U1 has the same phase and amplitude as those of the signal produced from the emitter of the transistor Q3 when R8, R9<<R2. Consequently, no current flows through the capacitor C1, and hence, the output signal (the low frequency component) from the operational amplifier U1 is produced at the output terminal 3 without being changed.

As the output level of the operational amplifier U1 declines, a current, corresponding to the difference between the amplitudes of the outputs produced from the emitter of the transistor Q3 and from the operational amplifier U1, flows through the capacitor C1. Thus, the high frequency component above the low frequency range of the switching circuit 6 is handled by the T-type switch 4 for the high frequency range. Accordingly, the input signal applied to the input terminal 1 is fed to the output terminal 3 from the DC to a high frequency. Here, a condition must be met that the pole formed by the resistor R1 and the capacitor C1 must be located lower than the first pole $F_0$ formed by the switching circuit 6 and the operational amplifier U1.

(2) AC COUPLING MODE

In this AC coupling mode, the switch SW6 is closed, and the input terminal 1 is AC coupled to the output terminal 3 through two paths as follows: The on-state switch SW6 forms an alternate-current coupling from the input terminal 1 to the input of the operational amplifier U1 through the switching circuit 6, and the low cutoff frequency thereof is determined by the capacitor C2 and the resistor R2. At the same time, the T-type switch 4 for the high frequency range AC couples the input terminal 1 and the output terminal 3 through the capacitor C1. Thus, the entire trigger source switching circuit is AC coupled from the input terminal 1 to the output terminal 3. The operation at the high frequency region is the same as that of the DC coupling.

(3) HIGH FREQUENCY REJECTION MODE

In this mode, the switch SW5 is closed, and the switches SW1 and SW2 are opened. When both switches SW1 and SW2 are open, both transistors Q2 and Q5 are in the on state, so that the input transistors Q1 and Q4 are cutoff, which maintains the T-type switches 4 and 5 non-conductive. Consequently, the input signals applied to the input terminals 1 and 2 are not transmitted through the T-type switches 4 and 5 for the high frequency component. In this case, the bases of the transistors Q3 and Q6 are fixed at the voltage +Vcc which is smaller than +$V_{DD}$, and hence, either the transistor Q3 or Q6, which has a smaller base-to-emitter voltage $V_{BE}$, is conductive. Thus, the capacitor C1 is AC grounded by the conductive transistor Q3 or Q6. As a result, the resistor R1 and the capacitor C1 seen from the output of the operational amplifier U1 form a low-pass filter, thereby achieving the high frequency rejection.

(4) LOW FREQUENCY REJECTION MODE

In this mode, the switch SW7 is closed so that the non-inverting input terminal of the operational amplifier U1 is grounded. Accordingly, the low frequency component of the input signal is not transmitted to the output terminal 3. In addition, since the connecting point of the output terminal of the operational amplifier U1 and the resistor R1 is virtually grounded, the capacitor C1 and the resistor R1 seen from the emitter of the transistor Q3 of the T-type switch 4 forms a high-pass filter, thereby achieving a low frequency rejection.

The invention has been described in detail with respect to an embodiment, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An oscilloscope trigger source switching circuit for switching input signals having a range of frequencies comprising:

a plurality of input terminals each of which receives one of a plurality of said input signals;

an output terminal;

a plurality of semiconductor switches, each connected to one of said plurality of input terminals, which selectively pass or block the input signal applied to the corresponding input terminal and function as a buffer amplifier of the higher frequency components of said range of frequencies;

a plurality of additional switches, each connected to one of said plurality of input terminals, which pass or block the lower frequency components of said range of frequencies;

a buffer amplifier connected to receive the outputs of said plurality of additional switches;

a capacitor connected between said output terminal and the outputs of said plurality of semiconductor switches; and a resistor connected between said output terminal and said buffer amplifier.

2. The trigger source switching circuit as claimed in claim 1, further comprising a switch control circuit for controlling each of said plurality of semiconductor switches to block its respective input signal, causing at least one of said plurality of semiconductor switches to AC ground said capacitor at an output side of said at least one of said plurality of semiconductor switches.

3. The trigger source switching circuit as claimed in claim 1, further comprising switching means for effectively grounding said resistor at an output side of said buffer amplifier so that said resistor and said capacitor form a high-pass filter.

4. The trigger source switching circuit as claimed in claim 1, wherein each of said plurality of semiconductor switches comprises an analog switch for opening and closing said semiconductor switch.

5. The trigger source switching circuit as claimed in claim 1, wherein each of said plurality of semiconductor switches comprises:
   a first emitter follower whose base is connected to one of said plurality of input terminals, and which functions as an input stage;
   a second emitter follower whose base is connected to an output of said first emitter follower, and which functions as an output stage; and
   a transistor for turning on said first and second emitter followers when the input signal applied to said first emitter is to be passed, and for turning off at least said first emitter follower when the input signal applied to said first emitter is to be blocked.

6. The trigger source switching circuit as claimed in claim 5, wherein said first emitter follower is turned off, said transistor locks an output of said second emitter follower at a fixed voltage in such a way that said capacitor is AC grounded.

7. The trigger source switching circuit as claimed in claim 4, wherein each of said plurality of additional switches is an analog switch.

8. The trigger source switching circuit as claimed in claim 7, further comprising a control circuit for controlling said analog switches for opening and closing said plurality of semiconductor switches and for controlling said plurality of additional switches.

9. The trigger source switching circuit as recited in claim 1 further including means for selectively connecting the output of said plurality of additional switches to the input of said buffer amplifier.

10. An oscilloscope trigger source switching circuit for switching input signals falling within a range of frequencies comprising:
   a plurality of input terminals each of which receives one of a plurality of said input signals;
   an output terminal;
   a first semiconductor switch system which selects one of said plurality of input signals and functions as a buffer amplifier of the selected input signal;
   aa second switch system which selects the input signal selected by said first semiconductor switch system, and passes the lower frequency components of said range of frequencies including a DC component of the selected input signal;
   a buffer amplifier;
   a third switch system which selectively provides DC coupling or AC coupling between said second switch system and said buffer amplifier;
   a first capacitor connected between an output terminal of said first semiconductor switch system and said output terminal;
   a first resistor connected between an output terminal of said buffer amplifier and said output terminal; and
   a switching control circuit for controlling said buffer semiconductor switch system, said second switch system and said third switch system.

11. The trigger source switching circuit as claimed in claim 10, wherein said first semiconductor switch system comprises grounding means for AC grounding said first capacitor at an output side of said first semiconductor switch system so that said first capacitor and said first resistor form a low-pass filter when said first semiconductor switch system is made nonconductive by said switch control circuit so as to block said plurality of input signals.

12. The trigger source switching circuit as claimed in claim 10, wherein said third switch system comprises switching means for AC grounding said first resistor at an output side of said buffer amplifier so that said first capacitor and said first resistor form a high-pass filter.

13. The trigger source switching circuit as claimed in claim 10, wherein said third switch system comprises a second resistor connected to an input terminal of said buffer amplifier, and a serial circuit of a second capacitor and an analog switch connected between an output of said second switch system and said input terminal of said buffer amplifier so that the second capacitor and the second resistor form a high-pass filter when the analog switch is made conductive by said switch control circuit.

14. The trigger source switching circuit as claimed in claim 10, wherein said first semiconductor switch system comprises analog switches which are controlled by said switch control circuit to pass the selected input signal and block the other input signals, said analog switches being interconnected so as not to be in the signal path of any one of said plurality of input signals.

15. The trigger source switching circuit as claimed in claim 10, wherein said second switch system comprises analog switches controlled by said switch control circuit to pass the lower frequency components of said range of frequencies including a DC component of the selected input signal and to block the other input signals.

16. An oscilloscope trigger source switching circuit for switching input signals having a range of frequencies comprising:
   a plurality of input terminals each of which receives one of a plurality of said input signals;
   an output terminal;
   a buffer amplifier;
   a first semiconductor switch system which selects one of said plurality of input signals and functions as a buffer amplifier of the selected input signal;
   a second switch system which selects the input signal selected by said first semiconductor switch system, and passes that portion of said input signal having the lower frequency components of said range of frequencies including a DC component of the selected input signal to said buffer amplifier;
   a first capacitor connected between an output terminal of said first semiconductor switch system and said output terminal;
   a first resistor connected between an output terminal of said buffer amplifier and said output terminal; and
   a switch control circuit for controlling said first semiconductor switch system and said second switch system.

17. The trigger source switching circuit as claimed in claim 16 further including means for selectively connecting the output of said second switch system to the input of said buffer amplifier.

* * * * *

UNITED STATES PATENT AND TRADEMARK OFFICE
CERTIFICATE OF CORRECTION

PATENT NO. : 5,262,681
DATED : November 16, 1993
INVENTOR(S) : Takuya Takeda

It is certified that error appears in the above-indentified patent and that said Letters Patent is hereby corrected as shown below:

Claim 6, Column 7, Line 22, after "wherein" insert --when--.

Claim 10, Column 7, Line 39, change "falling within" to --having--.

Claim 10, Column 7, Line 47, change "aa" to --a--.

Claim 10, Column 7, Line 62, delete "buffer" and insert --first--.
Claim 10, Column 7, line 62, "a switching" should read --a switch--.

Signed and Sealed this

Fourteenth Day of March, 1995

Attest:

BRUCE LEHMAN

*Attesting Officer*          *Commissioner of Patents and Trademarks*